United States Patent
Böttner et al.

(10) Patent No.: US 6,815,244 B2
(45) Date of Patent: Nov. 9, 2004

(54) METHODS FOR PRODUCING A THERMOELECTRIC LAYER STRUCTURE AND COMPONENTS WITH A THERMOELECTRIC LAYER STRUCTURE

(75) Inventors: Harald Böttner, Freiburg (DE); Axel Schubert, München/Zienken (DE); Joachim Nurnus, Neuenburg/Zienken (DE); Christa Künzel, Oberried/Zienken (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/608,620

(22) Filed: Jun. 27, 2003

(65) Prior Publication Data

US 2004/0102051 A1 May 27, 2004

(30) Foreign Application Priority Data

Jun. 27, 2002 (DE) .......................... 102 30 080

(51) Int. Cl.[7] .......................... H01L 21/06; H01L 29/18

(52) U.S. Cl. .......................... 438/54; 257/42; 257/102

(58) Field of Search ......................... 257/42, 467–470; 438/54, 55, 102, 103, 602–606

(56) References Cited

U.S. PATENT DOCUMENTS

| | | | | |
|---|---|---|---|---|
| 5,578,864 A | * | 11/1996 | Ochi et al. | .......... 257/467 |
| 5,885,345 A | | 3/1999 | Sakuragi | |
| 5,959,341 A | | 9/1999 | Tsuno et al. | |
| 2004/0075167 A1 | * | 4/2004 | Nurnus et al. | .......... 257/112 |

FOREIGN PATENT DOCUMENTS

| | | | | |
|---|---|---|---|---|
| DE | 198 45 104 A1 | 4/2000 | | |
| GB | 807619 | 1/1959 | | |
| JP | 03187280 | * | 8/1991 | .......... H01L/35/16 |

OTHER PUBLICATIONS

Boikov, Y.A. et al, "Layer by Layer Growth of Bi2Te3 Epitaxial Thermoelectric Heterostructures," 16th International Conference on Thermoelectrics, Dresden, IEEE, Aug. 1997, pp. 89–92.*

Magri, P. et al.: "Synthesis, Properties and Performances of Electrodeposited Bismuth Telluride Films", J. Mater. Chem. 1996, pp. 773–779.

Fleurial, J.P. et al.: "Development of Thick–Film Thermoelectric Microcoolers Using Electrochemical Deposition", Mat. Res. Soc. Symp. Proc., Materials Research Society, vol. 545, 1999, pp. 493–500.

Böttner, H. et.: "New Thermoelectric Components Using Micro–System–Technologies", Thermoelectric Materials, Proceedings 6th Workshop European Thermoelectric Society, Freiburg, 2001, 6 pages.

(List continued on next page.)

Primary Examiner—Matthew Smith
Assistant Examiner—Calvin Lee
(74) Attorney, Agent, or Firm—Laurence A. Greenberg; Werner H. Stemer; Gregory L. Mayback

(57) ABSTRACT

A method produces a thermoelectric layer structure on a substrate and the thermoelectric layer structure has at least one electrically anisotropically conductive V–VI layer, in particular a $(Bi, Sb)_2 (Te, Se)_3$ layer. The V–VI layer is formed by use of a seed layer or by a structure formed in the substrate, and disposed relative to the substrate such that an angle between the direction of the highest conductivity of the V–VI layer and the substrate is greater than 0°. The orientation can also be effected by an electric field. Components are formed of the thermoelectric layer structure in which the angle between the direction of the highest conductivity of the V–VI layer and the substrate is greater than 0°. As a result, the known anisotropy of the V–VI materials can advantageously be used for the construction of components.

26 Claims, 4 Drawing Sheets

OTHER PUBLICATIONS

Venkatasubramanian, R. et al.: "Thin–Film Thermoelectric Devices with High Room–Temperature Figures on Merit ", Nature, Macillan Magazines Ltd, vol. 413, Oct. 11, 2001, pp. 597–602.

Nurnus, J. et al.: "Epitaxial Bismuthtelluride Layers Grown on (111) Bariumfluoride Substrates Suitable for MQW–Growth", Proceedings 18$^{th}$ International Conference on Thermoelectrics, Baltimore, 1999, 4 pages.

Boikov, Y. A. et al.: "Layer by Layer Growth of $Bi_2$ $Te_2$ Epitaxial Thermoelectric Heterostructures", 16$^{th}$ International Conference on Thermoelectrics, Dresden, IEEE, Aug. 1997, pp. 89–92.

Zou, H. et al.: "Preparation and Characterization of p–Type $Sb_3$ $Te_2$ and n–Type $Bi_2$ $Te_3$ Thin Films Grown by Coevaporation", J. Vac. Sci. Technol. A 19 (3), American Vacuum Society, May/Jun. 2001, pp. 899–903.

* cited by examiner-

METHODS FOR PRODUCING A THERMOELECTRIC LAYER STRUCTURE AND COMPONENTS WITH A THERMOELECTRIC LAYER STRUCTURE

BACKGROUND OF THE INVENTION

Field of the Invention

The present patent application relates to methods for producing a thermoelectric layer structure on a substrate with at least one electrically anisotropically conductive V–VI layer, in particular a $(Bi, Sb)_2 (Te, Se)_3$ layer and to components incorporating such a thermoelectric layer structure.

Published, Non-Prosecuted German Patent Application DE 198 45 104 A1 discloses a method for producing thermoelectric converters (e.g. Peltier coolers). The latter are preferably produced on standard microelectronics wafers, such as e.g. $Si/SiO_2$. This prior art does not reveal how growth of thermoelectric materials, in particular of anisotropic V–VI materials such as $Bi_2Te_3$ can be achieved such that the known anisotropy can be used in a targeted manner for the construction of components.

It is known from thermoelectric components containing $Bi_2Te_3$, the most important material therefore, that $Bi_2Te_3$ is processed exclusively in a crystallographically favorably oriented manner. It is furthermore known from the publications presented below that material applied by thin-film techniques—sputtering, molecular beam coating methods, CVD, PVD, etc.—preferably grows with the c-axis perpendicular to the substrate surface. See the references by:
a) Zou, H. et al., titled "Preparation And Characterization Of p-Type $Sb_2Te_3$ And n-Type $Bi_2Te_3$ Thin Films Grown by Coevaporation", J. Vac. Sci. Technol. A (2001), Vol. 19, No. 3, pp. 899–903;
b) Boikov, Yu. et al., titled "Layer By Layer Growth Of $Bi_2Te_3$ Expitaxial Thermoelectric Heterostructures", Proceedings 16th International Conference on Thermoelectrics, Dresden, Germany, Aug. 1997, pp. 89–92;
c) Nurnus, J. et al., titled "Epitaxial Bismuth Telluride Layers Grown On (111) Barium Fluoride Substrates Suitable For MQW-Growth", Proceedings 18th International Conference on Thermoelectrics (ICT), Baltimore, USA, (1999), pp. 696–699; and
d) Venkatasubramanian, R. et al., titled "Thin-film Thermoelectric Devices With High Room-Temperature Figures Of Merit", Nature, Vol. 43, 11. October 2001, pp. 597–602.

This is unfavorable if, for the construction of thermoelectric components, the intention is to use structures and technologies such as in the above-mentioned Published, Non-Prosecuted German Patent Application DE 198 45 104 A1 and such as in the publication by Böttner, H. et al., titled "New Thermoelectric Components In Micro-System-Technologies", Proceedings 6th Workshop European Thermoelectric Society (ETS), Freiburg, (2001).

What is disadvantageous in the case of the known solutions is that thermoelectric components currently cannot be grown in an uniquely oriented manner (e.g. with the c-axis parallel to the substrate surface) on customary substrates using thin-film methods. It is an aim of the invention to uniquely set the known anisotropy of the V–VI materials in an advantageous manner for the construction of components.

SUMMARY OF THE INVENTION

It is accordingly an object of the invention to provide methods for producing a thermoelectric layer structure and components with a thermoelectric layer structure that overcome the above-mentioned disadvantages of the prior art methods and devices of this general type.

With the foregoing and other objects in view there is provided, in accordance with the invention, a method for producing a thermoelectric layer structure. The method includes the steps of providing a substrate, and forming at least one electrically anisotropically conductive V–VI layer on the substrate using the aid of a seed layer or a structure formed in the substrate. The V–VI layer is formed relative to the substrate with an angle between a direction of highest conductivity of the V–VI layer and the substrate being greater than 0°.

Through the use of a seed layer or by use of a structure applied on the substrate, the growth of the V–VI layer is controlled such that the angle between the direction of the highest conductivity of the V–VI layer and the substrate is greater than 0°. Consequently, the direction of the highest conductivity of the V–VI layer is not parallel to the substrate, which is advantageous for the use of a thermoelectric layer structure in components. In principle, however, a different orientation may also be advantageous, the invention enabling the targeted orientation.

In an advantageous refinement of the method, the angle between the direction of the highest conductivity of the V–VI layer and the substrate is between 30° and 90°, in particular between 85° and 90°.

It is also advantageous if the seed layer is formed in a textured manner. In this case, textured is understood to mean that one axis of a crystal forming the layer is disposed fixed with respect to a reference axis or area, but the other axes of the crystal can be oriented arbitrarily, in particular can also be rotated. This can be affected in a simple manner if the seed layer is deposited electrochemically and is disposed below or above the V–VI layer.

It is advantageous if at least one seed layer has a thickness of less than 500 nm, in particular of less than 100 nm. The thin configuration of the seed layer ensures a regular crystal growth.

Advantageously, at least one seed layer is disposed in at least two spatially separate regions on the substrate. This enables particularly selective etching.

In a further advantageous embodiment of the method according to the invention, a vertically structured pattern is applied on the surface of the substrate, and the V–VI layer can grow on the pattern such that the growth is directed in a targeted manner.

In this case, it is particularly advantageous if, before the vertically structured pattern is applied to the substrate, the substrate is pivoted by an angle with respect to the vertical. Advantageously, the substrate is pivoted by an angle such that the main deposition direction for the V–VI layer is perpendicular to a starting growth area of the structured pattern. As a result, it is possible to vary the angle between the direction of the highest conductivity and the substrate plane.

In an advantageous manner, in this case the (100) surface of a silicon wafer as the substrate is etched anisotropically in order to obtain oblique areas as a structured pattern.

It is also advantageous if, after the application of the oblique areas, an insulating layer, in particular a thermal oxide, is deposited.

In a further advantageous refinement of the method according to the invention, at least one V–VI layer is disposed on the substrate, the top seed layer is then disposed thereabove and a heat treatment is subsequently effected, so that the V–VI layer is oriented in such a way as to produce, proceeding from the top seed layer, an orientation of the previously random layer in the direction of the lowest or in the direction of the highest conductivity essentially perpendicular to the substrate.

In this case, the orientation of the at least one V–VI layer relative to the substrate, by application of an electric field, is effected such that the angle between the direction of the highest conductivity of the V–VI layer and the substrate is greater than 0°, in particular essentially 90°.

In this case, for the crystallographic orientation of thermoelectric layers during growth in thin-film processes, preferably during sputtering, an additional electric field is applied to the substrate electrode during the sputtering operation. This results in preferred growth orientation in the direction of maximum electrical conductivity. This is important e.g. in the case of $(Bi,Sb)_2(Te,Se)_3$ or V–VI-materials owing to its anisotropic thermoelectric properties. The growth orientation in the direction of the preferred a-axis becomes important as a result of the additional electric field.

In an advantageous manner, the orientation of the direction of the highest conductivity is supported by application of an electric field.

A component, in particular a Peltier cooler, a thermogenerator or a thermopile (converter of thermal radiation into electrical voltage), has a thermoelectric layer structure produced by one of the methods according to the invention.

A component having the at least one V–VI layer disposed such that the angle between the direction of the highest conductivity of the V–VI layer and the substrate is greater than 0°, in particular essentially 90°.

Other features which are considered as characteristic for the invention are set forth in the appended claims.

Although the invention is illustrated and described herein as embodied in methods for producing a thermoelectric layer structure and components with a thermoelectric layer structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
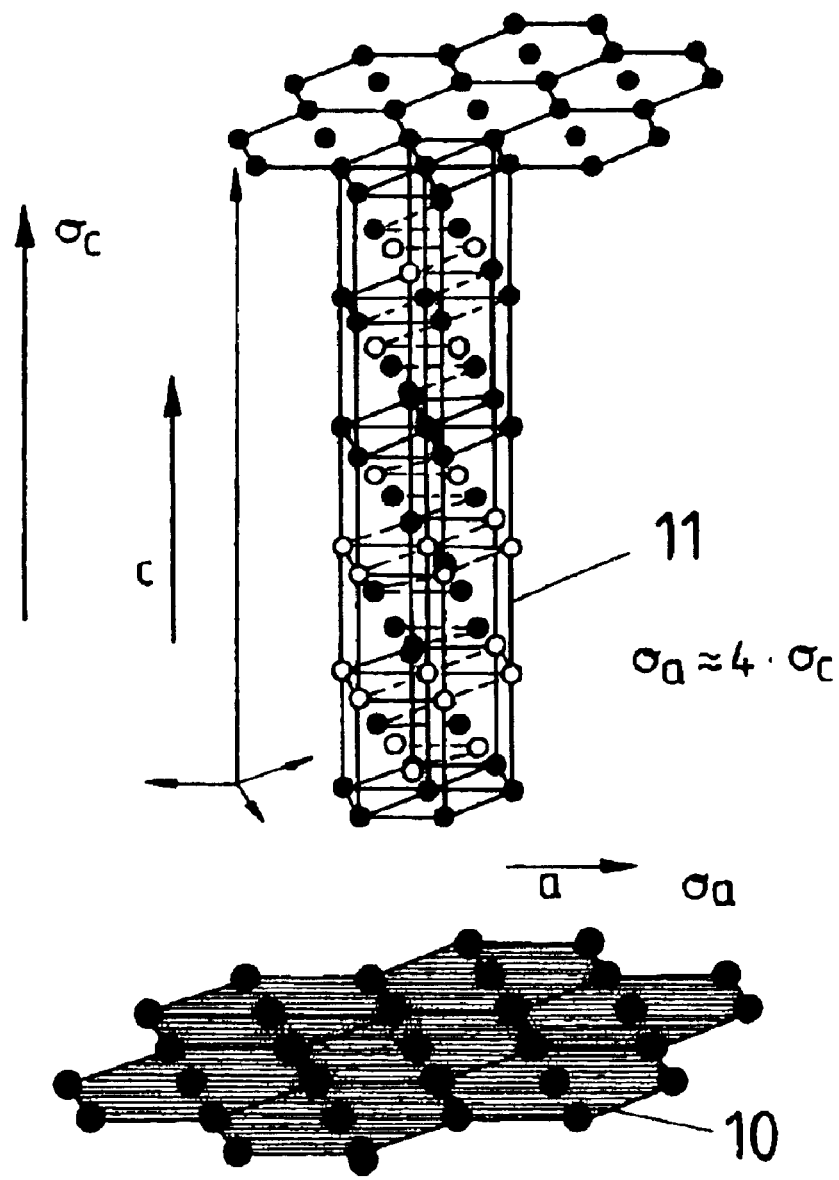
FIG. 1A is a diagrammatic, perspective view showing the growth of a $Bi_2Te_3$ layer on a structured substrate.
Figure 1B:
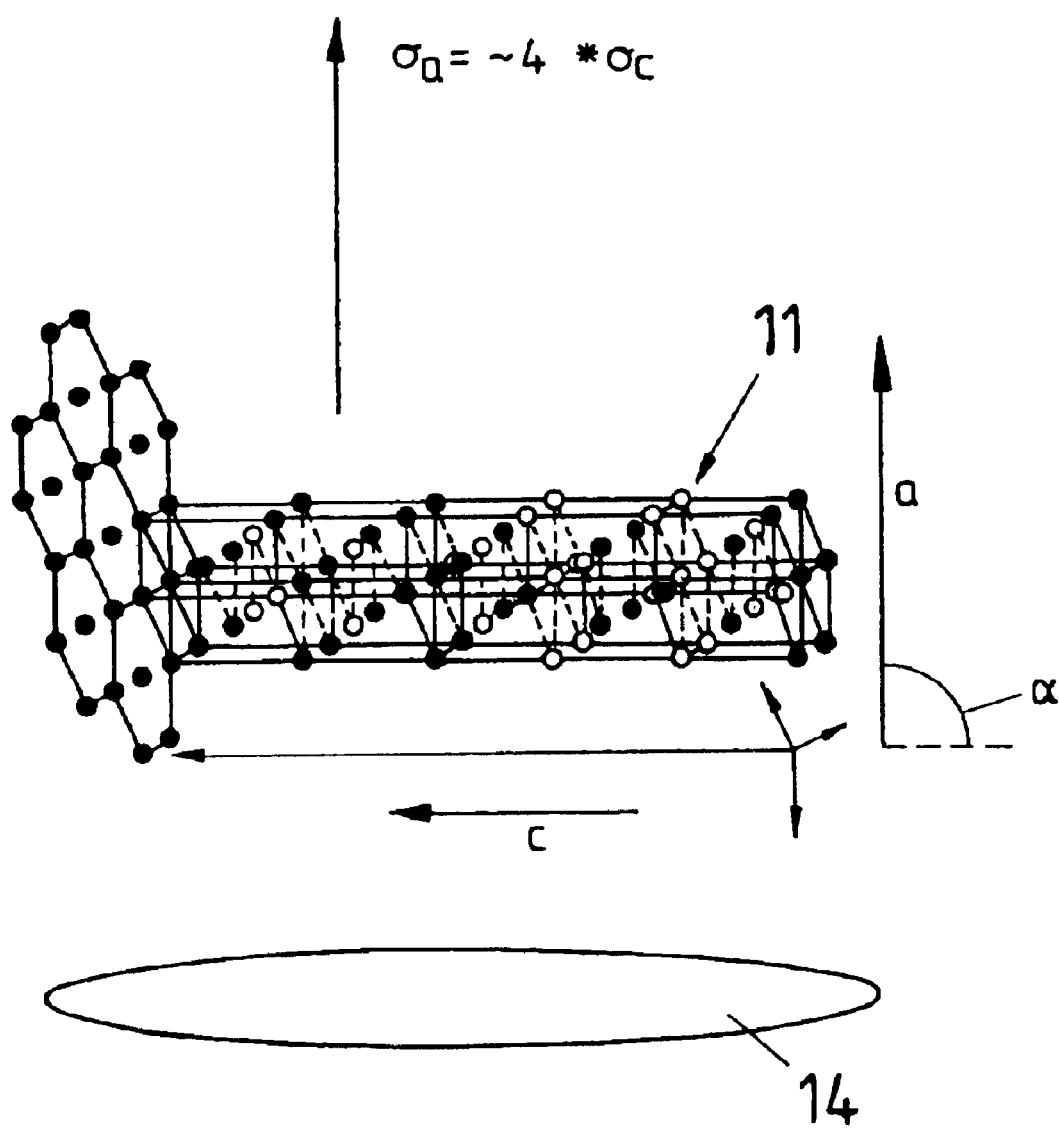
FIG. 1B is a perspective view showing the growth of the $Bi_2Te_3$ layer on an unstructured substrate in accordance with a first embodiment of the method according to the invention.

Referring now to the figures of the drawing in detail and first, particularly, to FIGS. 1A and 1B thereof, there is shown embodiments of a method according to the invention and of the component according to the invention with $Bi_2Te_3$ as a V–VI material. In principle, however, it is also possible to use other V–VI materials in particular $(Bi, Sb)_2 (Te, Se)_3$ compounds.

Embodiment 1

In particular for n-doped $Bi_2Te_3$ with strongly anisotropic electrical conductivity with a factor of four between the a-axis/c-axis direction, the start of the growth with a layer of the highest electrical conductivity in the growth direction, that is to say parallel to the a-axis is important for the utilization in components mentioned above. After production, the components are operated in such a way that the current direction is essentially perpendicular to a substrate 10, so that the orientation of the current conductivity is important.

Directed growth succeeds with an electrochemical starting layer, which grows in the direction of highest conductivity (a-plane of $Bi_2Te_3$) perpendicular to specific substrates while complying with specific experimental conditions. This is known from the following publications by:

a) Fleurial, J. P. et al., titled "Development of Thick Film Thermoelectric Microcoolers Using Electrochemical Deposition", Mat. Res. Soc. Symp. (1999), Vol. 545, pp. 493–500; and b) Magri, P. et al., titled "Synthesis, Properties And Performances Of Electrodeposited Bismuth Telluride Films", J. Mater, Chem., 1996, 6(5), pp. 773–779.

The further layers grow further, e.g. with the use of physical coating methods such as sputtering methods, for instance, in the manner of topotactic growth in the predetermined direction. The result is a material for the utilization of the components in accordance with the construction described in the published patent application mentioned.

FIG. 1A diagrammatically illustrates the growth of $Bi_2Te_3$ on a crystallographically matched substrate 10 made of barium fluoride. Like the thermoelectric semiconductor material, the substrate 10 has a hexagonal configuration of atoms in the corresponding surface. Thus, with appropriate process control, the material will preferably grow in the same crystallographic order owing to the structural relationship thus prescribed. In the growth direction of the c-axis, the material has an electrical conductivity $\sigma_c$, a factor of four poorer than the conductivity $\sigma_a$ parallel to the surface of the substrate, in other words perpendicular to the growth direction.

Consequently, an angle α between the direction with the highest conductivity (a-axis) and the substrate 10 is 0°, i.e. the conductivity is highest parallel to the substrate 10, which is undesirable. In this case, the angle a is understood to be the smallest angle between the a-axis and the plane of the substrate 10 in the direction of the projection of the a-axis onto the plane, i.e. the angle may lie between 0° and 90°.

A component constructed on such a substrate is operated in accordance with Published, Non-Prosecuted German Patent Application DE 198 45 104 A1 preferably in the growth direction of the c-axis. This is unfavorable with regard to the necessary utilization of good electrical conductivity. For reasons of clarity, the illustration of the metal contacts for the components is dispensed with in FIG. 1A and for the further figures.

If the direction of best electrical conductivity is correspondingly intended to be utilized for the operation of a component made of the anisotropic material, the growth on a substrate must be effected such that the material grows in the direction of the a-axis.

According to the first embodiment of the method according to the invention, the growth preferably succeeds on a substrate without a structural relationship, in that first a thermoelectric bottom seed layer 14 is deposited electrochemically, this being illustrated in FIG. 1B. The layer is referred to here as the bottom seed layer 14 since it is disposed below the V–VI layer 11. The fourth embodiment (FIGS. 4A, 4B) uses a top seed layer 13 disposed above the V–VI layer 11. What is important is that both seed layers 13, 14 serve for controlling the orientation of the growth of the V–VI layer 11 in the direction of the a-axis. In this case, the seed layers 13, 14 are made thin, i.e. less than 500 nm, in particular less than 100 nm. The seed layers 13, 14 may be formed of the same material as the substrate 10, the crystal structure being formed differently.

The bottom seed layer 14 will preferably be oriented in the direction of maximum electrical conductivity, i.e. the a-axis. In this case, the angle a between the direction of the highest conductivity (a-axis) and the substrate 10 is ideally 90°; it is still essentially 90° in the case of production-dictated deviations.

As a result, the layer having the best thermoelectric properties results with regard to the useful direction mentioned above. Given as orientation thus prescribed by the bottom seed layer 14, subsequently deposited materials follows this orientation. This subsequent deposition may be carried out by customary PVD or CVD methods.

Embodiment 2

In a second embodiment, the usually planar substrate surface, also see Published, Non-Prosecuted German Patent Application DE 198 45 104 A1, is structured by a regular height pattern, i.e. a vertical pattern. To that end, e.g. the surface of the (100) Si wafer is subjected to anisotropic dry or wet etching in order e.g. to obtain a roof-tile-shaped pattern with many oblique areas. This is illustrated diagrammatically in FIG. 2. Structures that are inclined with respect to one another are formed as a result. After the etching, an insulator, e.g. thermal oxide, is deposited on the silicon. The etching depth will lie in the range of sub$\mu$m to $\mu$m. An etchant used is e.g. 0.01 n $HNO_3$.

The inclined areas bring about, according to the known prior art, growth of the c-axis of the $Bi_2Te_3$ crystals 11 perpendicular to the inclined areas. The further layer growth of the V–VI layer then follows the first growth layer. This ultimately has the effect that the $Bi_2Te_3$ crystals are oriented essentially in a manner tilted through the etching angle with respect to the original substrate surface. The angle α between the a-axis and the plane of the substrate 10 is greater than 0° and less than 90°, approximately 30° in the present example.

This represents a significant improvement for the thermoelectric effectiveness of the material in the direction perpendicular to the original substrate surface.

Figure 2:
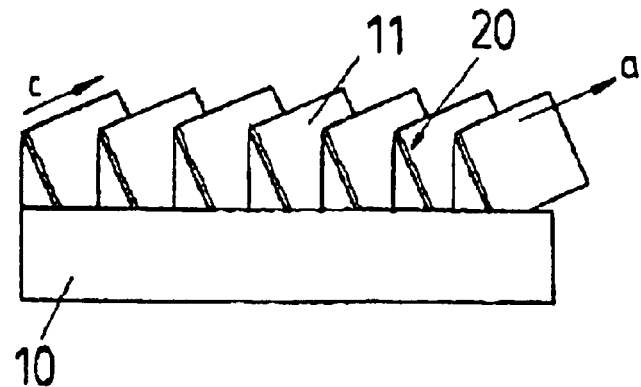
FIG. 2 is a perspective view showing an anisotropically etched substrate in accordance with a second embodiment of the method according to the invention.

FIG. 2 diagrammatically shows the directed growth with the aid of the anisotropically etched substrate 10. The illustration of the growth in the etching depressions has been dispensed with for this diagrammatic illustration.

Embodiment 3

In the third embodiment of the method according to the invention, the usually planar surface of the substrate 10 is structured by a regular height pattern as in the second embodiment, but the substrate 10 is tilted through an angle β with respect to the perpendicular. Analogously to the second embodiment, the surface of the (100) Si wafer 10 is subjected to anisotropic dry or wet etching in order e.g. to obtain a roof-tile-shaped pattern, as in illustrated in FIGS. 3A and 3B.

Figures 3A, 3B:
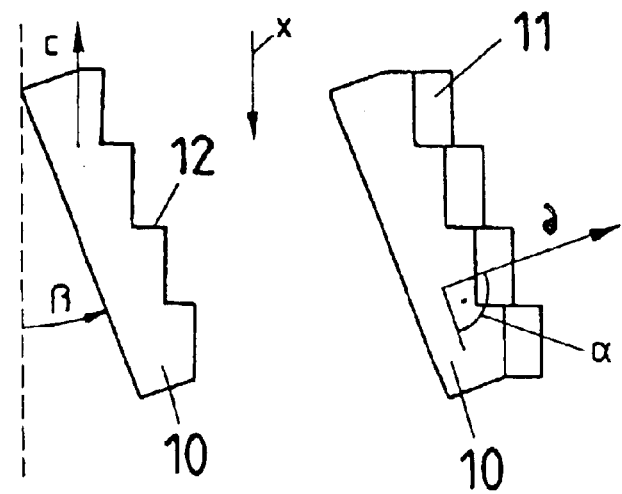
FIG. 3A is an illustration showing an inclination of a structured substrate as a first step of a third embodiment of the method according to the invention.
FIG. 3B is an illustration showing a deposition of $Bi_2Te_3$ on the inclined substrate as a second step of the third embodiment of the method according to the invention.

FIG. 3A illustrates the substrate 10 provided with bevels (analogously to FIG. 2), the substrate being pivoted through an angle β with respect to the perpendicular.

The main direction X of the subsequent deposition of the $Bi_2Te_3$ crystals 11 (see FIG. 3B) is perpendicular, i.e. into the bevels. The main deposition direction X is perpendicular to a starting growth area 12 of the applied structure.

After the etching, an insulator, e.g. thermal oxide, is deposited on the silicon. The etching depth will lie in the range of sub-$\mu$m to $\mu$m.

Through the pattern of bevels, the angle α between the substrate 10 and the a-axis differs from those of the second embodiment. This results in the formation of structures with preferably a right angle at the tip and ratios of the limbs to one another of preferably >2:1.

The areas inclined in this way bring about, according to the known prior art, growth of $Bi_2Te_3$ crystals 11 as depicted if the wafer is incorporated in an inclined manner during the layer growth of $Bi_2Te_3$ such that the main deposition direction X is perpendicular to the starting growth area 12. This ultimately has the effect that the crystals are oriented in a tilted manner with respect to the original substrate surface. After such orientation of the growth in a starting area, the further layers grow further with the predetermined direction. Thus, after the orientation of the structure as a feed layer, the wafer can be inclined into the optimum orientation for rapid growth. In other words, the wafer is preferably oriented with its original surface perpendicular to the main direction of the deposition. This represents a significant improvement compared with the customary growth—depicted in FIG. 1A—for the thermoelectric effectiveness of the material in the direction perpendicular to the original substrate surface. The direction of the a-axis can be influenced within wide limits through the choice of the angle β. It is possible to obtain angles α of inclination in the range of greater than 0° to 90°.

Embodiment 4

The fourth embodiment is a modification of the first embodiment since the unstructured substrate 10 is likewise used as a starting point.

A disordered layer of the thermoelectric material, e.g. comprising $Bi_2Te_3$, is then first deposited, as described e.g. in the article by Böttner et al. cited above. Such layers containing the thermoelectric material (e.g. $Bi_2Te_3$) can be deposited e.g. on layers, as described by the reference by Nurnus et al.

Figure 4A:
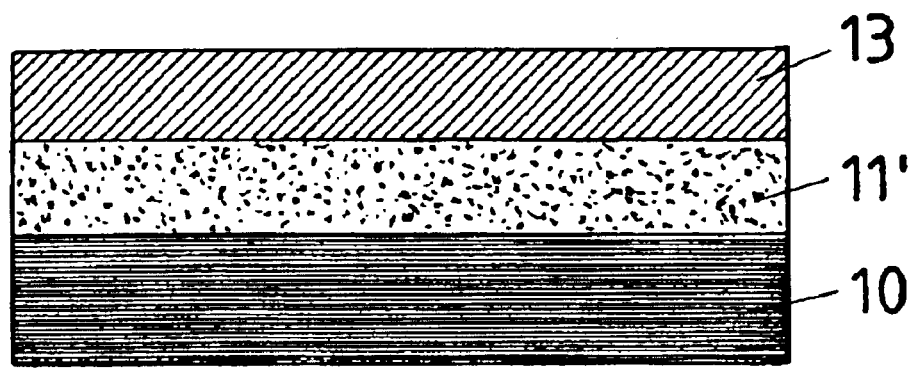
FIG. 4A is a sectional view showing a first step of a fourth embodiment of the method according to the invention.
Figure 4B:
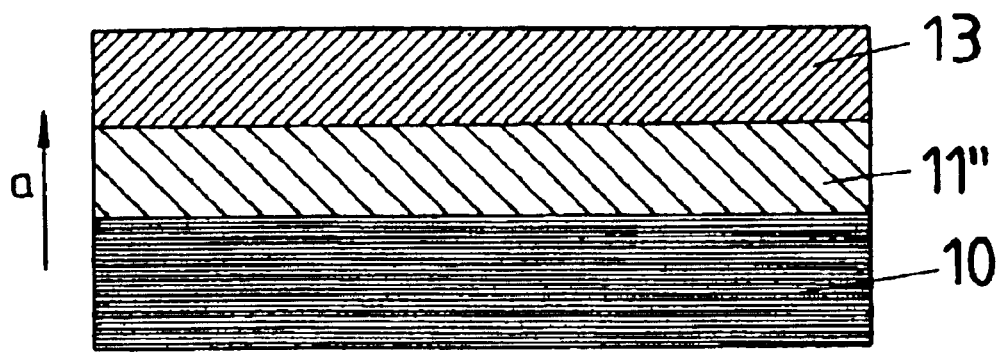
FIG. 4B is a sectional view showing a second step of a fourth embodiment of the method according to the invention.

In order to utilize this for orientation of the thermoelectric material after random growth, after sputtering of a few sub-$\mu$m to $\mu$m of $Bi_2Te_3$, a crystallographically oriented top seed layer 13 is deposited, heat treatment subsequently being effected (FIGS. 4A, 4B). During the heat treatment operation, the thermoelectric layer is oriented downward starting from the top at the top seed layer 13. The top seed layer 13 is then etched away, and $Bi_2Te_3$ continues to be sputtered on. The further layers then grow in accordance with the orientation prescribed by the top seed layer 13.

FIG. 4A illustrates the state prior to the heat treatment. The $Bi_2Te_3$ layer 11' is disposed on the substrate 10 and the top seed layer 13 is disposed above the layer. In this state, the $Bi_2Te_3$ layer 11' is not yet oriented in the direction of the electrical conductivity.

This is affected after the heat treatment, which is illustrated in FIG. 4B. The a-axis of the better electrical conductivity in the $Bi_2Te_3$ layer 11' is then essentially perpendicular to the substrate 10, as analogously illustrated in FIG. 1B. The heat treatment is affected in a temperature range of 250 to 500° C., preferably at, 300° C. The heat treatment duration depends on the layer thickness, so that heat treatment durations of half a minute to approximately ten days are possible. An advantageous heat treatment duration is approximately 5 h at 300° C.

The embodiment of the invention is not restricted to the preferred exemplary embodiment specified above. Rather, a number of variants are conceivable which also make use of the method according to the invention in the case of embodiments of fundamentally different design.

We claim:

1. A method for producing a thermoelectric layer structure, which comprises the steps of:
   providing a substrate; and
   forming at least one electrically anisotropically conductive V–VI layer on the substrate using the aid of one of a seed layer and a structure formed in the substrate, the V–VI layer being formed relative to the substrate with an angle between a direction of highest conductivity of the V–VI layer and the substrate being greater than 0°.

2. The method according to claim 1, which further comprises setting the angle between the direction of the highest conductivity of the V–VI layer and the substrate to be between 30° and 90°.

3. The method according to claim 2, which further comprises setting the angle to be between 85° and 90°.

4. The method according to claim 1, which further comprises forming the seed layer to have a thickness of less than 500 nm.

5. The method according to claim 4, which further comprises setting the thickness to be less than 100 nm.

6. The method according to claim 1, which further comprises depositing the seed layer electrochemically and disposed one of below and above the V–VI layer.

7. The method according to claim 1, which further comprises forming a vertically structured pattern in a surface of the substrate for forming the structure on the substrate.

8. The method according to claim 7, which further comprises pivoting the substrate by a further angle with respect to the vertical before the vertically structured pattern is formed in the substrate.

9. The method according to claim 8, which further comprises pivoting the substrate by the further angle such that a main deposition direction for the V–VI layer is perpendicular to a starting growth area of the vertically structured pattern.

10. The method according to claim 7, which further comprises:
    using a silicon wafer as the substrate; and
    etching anisotropically a surface of the silicon wafer to obtain oblique areas for forming the vertically structured pattern.

11. The method according to claim 7, which further comprises depositing an insulating layer on the substrate after a formation of the oblique areas.

12. The method according to claim 11, which further comprises using a thermal oxide for forming the insulating layer.

13. The method according to claim 1, which further comprises applying an electric field for affecting an orientation of the direction of the highest conductivity.

14. The method according to claim 1, which further comprises forming the V–VI layer as a $(Bi, Sb)_2 (Te, Se)_3$ layer.

15. The method according to claim 1, which further comprises forming the seed layer in a textured manner.

16. The method according to claim 1, which further comprises disposing the seed layer in at least two spatially separate regions on the substrate.

17. The method according to claim 1, which further comprises disposing the V–VI layer on the substrate;
    disposing the seed layer above the V–VI layer; and
    performing subsequently a heat treatment process, so that the V–VI layer is oriented to produce, proceeding from the seed layer an orientation of the direction of the highest conductivity substantially perpendicular to the substrate.

18. The method according to claim 1, which further comprises
    disposing the V–VI layer on the substrate;
    disposing the seed layer above the V–VI layer; and
    performing subsequently a heat treatment process, so that the V–VI layer is oriented to produce, proceeding from the seed layer an orientation of a direction of a lowest conductivity substantially perpendicular to the substrate.

19. A component, comprising:
    a thermoelectric layer structure produced by the method according to claim 1.

20. The component according to claim 19, wherein the component is selected from the group consisting of a Peltier cooler, a thermogenerator, and a thermopile.

21. A method for producing a thermoelectric layer structure, which comprises the steps of:
    providing a substrate; and
    forming at least one electrically anisotropically conductive V–VI layer on the substrate with an orientation of the V–VI layer relative to the substrate, being effected by applying an electric field such that an angle between a direction of highest conductivity of the V–VI layer and the substrate being greater than 0°.

22. The method according to claim 21, which further comprises forming the V–VI layer as a $(Bi, Sb)_2 (Te, Se)_3$ layer.

23. The method according to claim 21, which further comprises setting the angle to be approximately 90°.

24. A component having a thermoelectric layer structure, comprising:
    a substrate; and
    at least one electrically anisotropically conductive V–VI layer disposed on said substrate, said V–VI layer being disposed such that an angle between a direction of highest conductivity of said V–VI layer and said substrate being greater than 0°.

25. The component according to claim 24, wherein said angle is approximately 90°.

26. The component according to claim 24, wherein said V–VI layer is a $(Bi, Sb)_2 (Te, Se)_3$ layer.

* * * * *